United States Patent
Veendrick et al.

(10) Patent No.: US 7,102,254 B2
(45) Date of Patent: Sep. 5, 2006

(54) INTEGRATED CIRCUIT AND BATTERY POWERED ELECTRONIC DEVICE

(75) Inventors: Hendricus Joseph Maria Veendrick, Eindhoven (NL); Rinze Ida Mechtildis Peter Meijer, Eindhoven (NL); Kiran Batni Raghavendra Rao, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 27 days.

(21) Appl. No.: 10/502,183

(22) PCT Filed: Dec. 18, 2002

(86) PCT No.: PCT/IB02/05602

§ 371 (c)(1),
(2), (4) Date: Jul. 21, 2004

(87) PCT Pub. No.: WO03/063356

PCT Pub. Date: Jul. 31, 2003

(65) Prior Publication Data

US 2005/0174161 A1 Aug. 11, 2005

(30) Foreign Application Priority Data

Jan. 23, 2002 (EP) .................................. 02075274

(51) Int. Cl.
*H01H 35/00* (2006.01)
(52) U.S. Cl. ........................................ 307/126; 327/544
(58) Field of Classification Search ................. 307/126; 327/544
See application file for complete search history.

(56) References Cited

U.S. PATENT DOCUMENTS

| | | | |
|---|---|---|---|
| 4,722,372 A * | 2/1988 | Hoffman et al. ............... | 141/98 |
| 5,343,088 A | 8/1994 | Jeon ......................... | 307/296.2 |
| 5,347,172 A | 9/1994 | Cordoba .................... | 307/296.2 |
| 5,461,338 A | 10/1995 | Hirayama et al. ........... | 327/534 |
| 5,612,645 A | 3/1997 | Halepete ..................... | 327/537 |
| 5,672,995 A | 9/1997 | Hirase et al. ................ | 327/534 |
| 5,744,996 A | 4/1998 | Kotzle et al. ................ | 327/534 |
| 5,781,062 A * | 7/1998 | Mashiko et al. ............. | 327/544 |
| 6,124,752 A | 9/2000 | Kuroda ....................... | 327/534 |
| 6,225,852 B1 | 5/2001 | Cleveland | |
| 6,275,094 B1 | 8/2001 | Cranford, Jr. ............... | 327/534 |
| 6,329,874 B1 * | 12/2001 | Ye et al. ..................... | 327/544 |
| 2004/0227542 A1* | 11/2004 | Bhavnagarwala et al. .... | 326/83 |
| 2006/0012391 A1* | 1/2006 | Huang ........................ | 324/769 |

OTHER PUBLICATIONS

US 6,232,825, 05/2001, Manning (withdrawn)

* cited by examiner

*Primary Examiner*—Brian Sircus
*Assistant Examiner*—Daniel Cavallari

(57) ABSTRACT

An integrated circuit (100) has a circuit portion (102) that can be switched to a standby mode through an enable transistor (104), which is coupled between an internal power supply line (120) and an external power supply line (130). The enable transistor (104) is controlled by control circuitry via a control line (160). The control line (160) is coupled to the gates of a first transistor (152) and a further transistor (154) of a logic gate (150). The substrate of the further transistor (154) is coupled to a backbias generator (170). Consequently, when the enable transistor (104) is switched off, the further transistor (154) is enabled and applies a substantial backbias to the gate of the enable transistor (104), thus dramatically reducing the leakage current from the circuit portion (102) through the enable transistor (104).

4 Claims, 1 Drawing Sheet

INTEGRATED CIRCUIT AND BATTERY POWERED ELECTRONIC DEVICE

Figure 1:
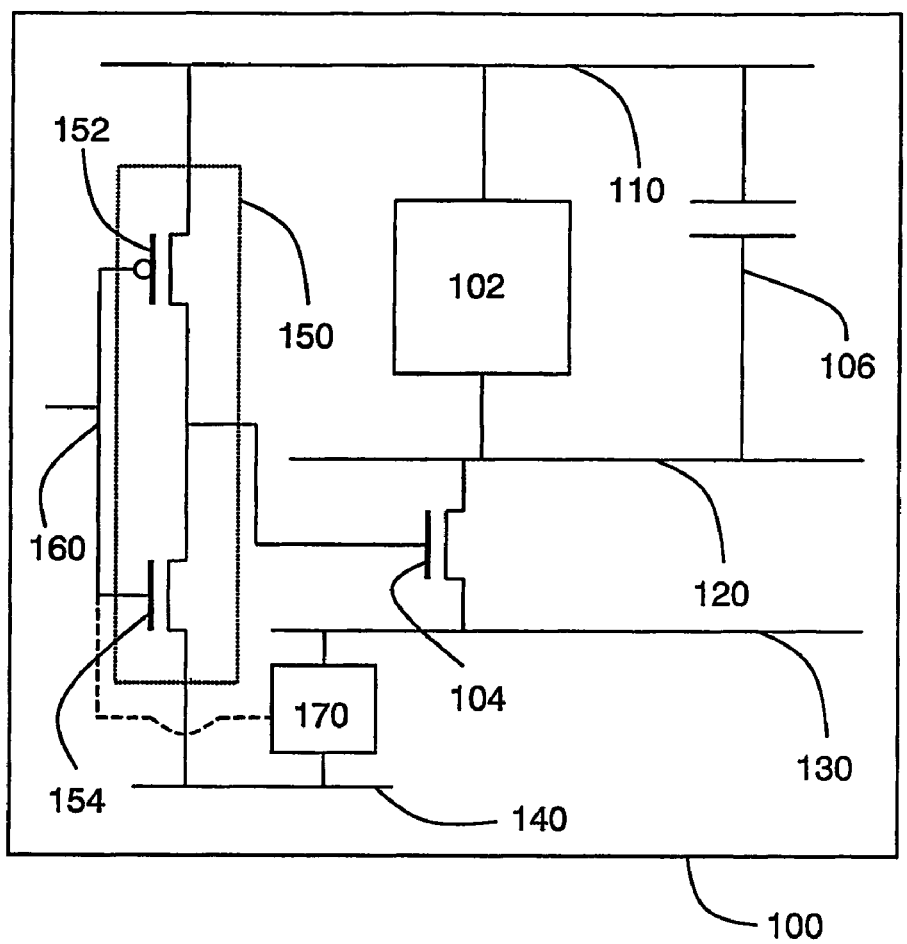

The present invention relates to an integrated circuit, comprising:

an external power supply line, an internal power supply line, a circuit portion coupled to the internal power supply line, an enable transistor for coupling the internal power supply line to the external line; and control means coupled to a gate of the enable transistor for switching the enable transistor to a conductive state with a first gate voltage, and to a non-conductive state with a second gate voltage.

The present invention further relates to a battery-powered electronic device having such an integrated circuit.

An embodiment of such an integrated circuit is known from from IEEE Journal of Solid State Circuits, Vol. 32 (1); p. 52–61, 1997.

In the art of IC design, the ongoing downscaling of transistor dimensions allows for an increase of the transistor density on an IC, which enables the development of increasingly complex ICs. However, the increase in transistor density also introduces significant complications. Apart from the increase of noise, cross-talk and numerous design technology pitfalls, to name but a few problems, these very large scale integrated (VLSI) circuits also consume large amounts of power during operation. In addition, with the reduction of transistor dimensions and supply voltage, the threshold-voltage ($V_T$) of these transistors is usually lowered as well, to enable high-frequency switching of the transistors. This causes an increase in the leakage currents for these transistors, which adds to the total power consumption of the circuit and to the standby current in particular. This especially causes problems in terms of battery lifetime for battery-powered devices that include such circuitry, like hand-held devices, lap top computers, mobile phones, portable CD players and so on. Therefore, low-power consumption is an important issue in the design of the ICs, particularly when these ICs are being used in such devices.

The complementary metal oxide semiconductor (CMOS) circuit known from the aforementioned prior art has a low-power design by the presence of an enable transistor coupled to the control circuitry for coupling the external power line to the internal power line, e.g. a pMOS high-$V_T$ transistor coupled between the external supply line ($V_{dd,\,ext}$) and the internal supply line ($V_{dd,\,int}$) of the circuit. The high-$V_T$ transistor is controlled by an enable/disable control signal from the control circuitry by switching the gate voltage of the enable transistor between a first gate voltage and a second gate voltage, thus enabling/disabling the current supply to the circuit portion. By switching off large parts of an IC, for instance during stand-by mode of an e.g. battery-powered device, a significant saving of consumed power is achieved, resulting in increased battery lifetime. The use of a high-$V_T$ transistor reduces the leakage currents from the circuit portion in stand-by mode by one or two decades.

The disadvantage of using a high-$V_T$ transistor is that a different technology has to be used for the enable transistor than the technology being used for the circuit portion, which increases the complexity of the IC design and the IC production cost. In addition, in order to avoid a significant voltage drop over a high-$V_T$ transistor, such a transistor must be relatively large, which adds to the overall area of the integrated circuit, which also increases the IC production cost.

It is an object of the present invention to provide an integrated circuit of the kind described in the opening paragraph in which the enable transistor can be realized in the same technology as the circuit portion without increasing the standby leakage current compared to a high-$V_T$ enable transistor.

Now, the object is realized in that the control means are arranged to reduce a leakage current through the enable transistor in the non-conductive state by biasing the second gate voltage.

By biasing the second gate voltage, e.g. applying a gate backbias voltage to the gate of the enable transistor, the voltage gap between the threshold voltage of the enable transistor and the voltage of the enable transistor in its non-conductive state is widened. This can result in a significant reduction of the standby leakage current from the circuit portion through the transistor; for instance, a gate backbias voltage of just 100 mV reduces the subthreshold leakage current through the transistor with a factor 10–15, and application of a gate backbias of a few volts decreases the subthreshold leakage by more than 10 decades. Although other leakage current paths exist in an IC, the subthreshold leakage currents of transistors is the predominant contribution to the overall current leakage in deep-submicron technologies, which stipulates the importance of the present invention.

In a preferred embodiment, the control means comprise a further transistor having a substrate that is conductively insulated from a bulk substrate of the integrated circuit, the substrate being coupled to a bias voltage source, and the further transistor being responsive to a control signal for switching the enable transistor to a non-conductive state. At this point, it noted that the use of substrate and/or well backbias voltage techniques to reduce leakage currents is known from the art. For instance, U.S. Pat. No. 5,744,996 discloses a CMOS circuit which can be tuned to operate at different supply voltages by applying a backbias voltage to the substrate of the transistors in the circuit. In another U.S. Pat. No., e.g. 6,124,752, a solution has been provided for the problem of having to apply a third supply voltage, e.g. the backbias voltage next to the nominal supply voltage $V_{dd}$ and ground supply voltage $V_{ss}$ of the circuit, by using a charge pump being responsive to dedicated control circuitry for removing charges from the substrate. The common approach of the architectures described in these patents is, however, to either apply backbias voltages to a part of the circuit, e.g. a circuit portion, in which case triple-well technologies or other insulating techniques are required, or to apply it the whole circuit. However, the application of backbias voltages to large parts of the integrated circuit has the disadvantage that a backbias generator like a charge pump has to control large volumes of substrate, which has a negative effect on either the size of the backbias generator or on the actual time period in which the application of the backbias is effectuated. In addition, it is expected the positive effect of applying backbias voltages to reduce leakage currents will become smaller with the further downscaling of technology dimensions because of the expected reduction of the so-called k-factor, as expressed in the following formula:

$$V_T = V_x + k\sqrt{(V_{sb} + 2\phi_F)}$$

with $V_T$ being the threshold voltage, $V_x$ being a process related constant threshold voltage term, k being the body factor or k-factor which depends on the oxide capacitance per unit area oxide in the technology, $\phi_F$ being the Fermi level, and $V_{sb}$ being the source-bulk or backbias voltage. It will be recognized by those skilled in the art that with a decreasing k-factor, the impact of the backbias on the increase of the threshold voltage will become more moderate, which results in a smaller reduction of leakage currents from the circuit or circuit portions.

It is emphasized that the aforementioned embodiment does not significantly suffer from this expected deterioration of the impact of the k-factor; both the circuit portion and the enable transistor are realized in a default technology, while the transistor being responsible for generating the backbias voltage to be applied to the gate of the enable transistor is connected to a backbias source. Therefore, this transistor, but not the circuit portion and the enable transistor, will experience increased leakage currents in standby as a result of the reduced k-factor in future technologies, which is a negligible contribution to the leakage currents of an IC typically having millions of transistors. Furthermore, the realization of the vast majority of the IC in a standard technology, e.g. CMOS technology, has the advantage that standard library cells using the nominal power supply lines $V_{dd}$ and $V_{ss}$ can be used for both the circuit portion and the enable transistor and that the power supply line routing issues for applying the backbias voltage remain limited to the transistor responsible for generating the gate backbias of the enable transistor. In addition, because of the modest size of the substrate area of the transistor being responsible for generating the backbias voltage to be applied to the gate of the enable transistor, the backbias can be rapidly established, in contrast to the known backbias applications, where more substantial substrate areas have to be biased.

It is an advantage if the bias voltage source comprises a backbias generator being responsive to the control signal.

By making the backbias generator responsive to the control signal, the backbias generator is only switched on when necessary, e.g. when the circuit portion is switched to a standby mode, which reduces the power consumption of the backbias generator.

An important quality of battery powered devices is the length of the operational period; i.e. the period in which the device will function without having to recharge the batteries. Typically, an increase of the operational period of such a device strengthens its market position considerably, which is especially the case for mobile phones and laptop computers, to name but a few battery powered devices. Battery powered devices utilizing an IC according to the invention can provide longer operational times due to the fact that large parts of the IC can be switched off with a dramatic reduction of the leakage currents from the circuit portions in standby mode, which improves the market position of the device as a whole.

Figure 2:
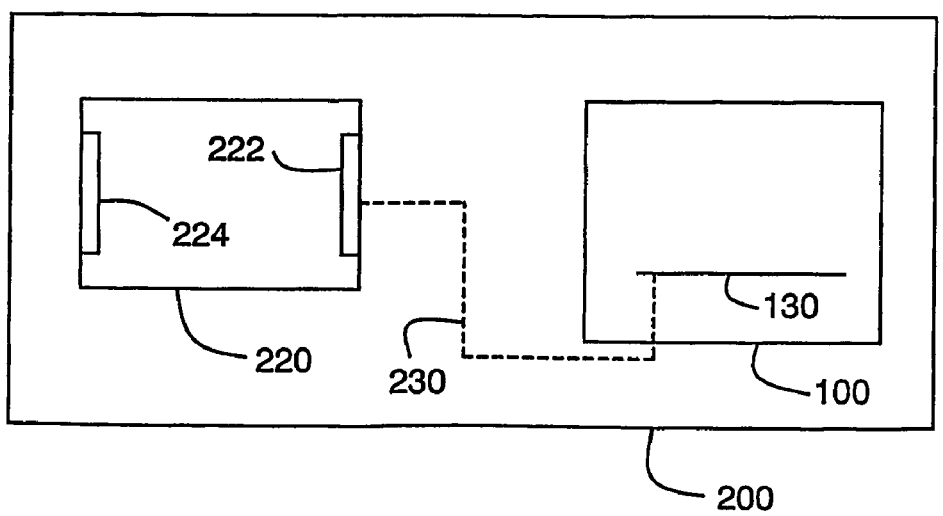

The integrated circuit and device according to the invention are described in more detail and by way of non-limiting examples with reference to the accompanying drawings, wherein:

FIG. 1 shows a circuit with an on/off switching facility according to an embodiment of the invention; and FIG. 2 shows a battery powered device having an integrated circuit with an on/off switching facility according to the invention.

In FIG. 1, integrated circuit 100 has a circuit portion 102. Circuit portion 102 is coupled between a power supply line 110 and an internal power supply line 120, which is coupled to an external power supply line 130 by enable transistor 104. Optionally, a decoupling capacitor 106 is coupled between power supply line 110 and internal power supply line 120 for compensating glitches in the power supply voltage during powerup of circuit portion 102. The gate of enable transistor 104 is coupled to a logic gate 150, e.g. an inverter, having a transistor 152 for generating a first gate voltage for switching the enable transistor 104 to a conductive state and a further transistor 154 for generating a second gate voltage for switching the enable transistor 104 to a non-conductive state. Other logic gates can be used without departing from the scope of the invention.

The substrate of the further transistor 154 is coupled to a backbias source 170, e.g. a backbias generator like a charge pump or another known device for generating a backbias, via the backbias power supply line 140. The gates of transistor 152 and further transistor 154 are coupled to control circuitry not shown via a control signal line 160. It is emphasized that, for reliability reasons, transistor 154 is preferably implemented as a cascade of two transistors in order to withstand the increased gate-source and gate-drain voltages that result from the applied backbias when transistor 154 is switched to a conductive state. The control circuitry not shown, which can be integrated into the integrated circuit 100 or be positioned at least partly outside integrated circuit 100, is used to control the operational mode of the circuit portion 102, e.g. either in active or in standby mode. Optionally, backbias source 170 is also connected to control signal line 160, as indicated by the dashed part of this line, in the case that backbias source 170 has been made responsive to the control circuitry as well. In FIG. 1, backbias source 170 is integrated in the integrated circuit 100, since this is the preferred arrangement. However, it will be obvious to those skilled in the art that an external backbias source coupled to the further transistor 154 via an input pin not shown of the integrated circuit 100 can also be used without departing from the teachings of the present invention.

In the embodiment shown in FIG. 1, power supply line 110 is a $V_{dd}$ line, internal power supply line 120 is an internal $V_{ss}$ line, and external power supply line 130 is an external $V_{ss}$ line, with enable transistor 104 being an nMOS transistor. This is the preferred embodiment, because nMOS transistors have a better conductance than pMOS transistors, which is useful when large currents have to flow through the circuit portion 102 in its active mode. In this embodiment, the backbias applied to the enable transistor is in fact a negative voltage, preferably of several volts. However, it will be understood by those skilled in the art that power supply line 110 can be a $V_{ss}$ line, internal power supply line 120 can be an internal $V_{dd}$ line, and external power supply line 130 can be an external $V_{dd}$ line, with enable transistor 104 being an pMOS transistor without departing from the scope of the invention. In the latter case, the applied backbias will be a more positive voltage than $V_{dd}$ to increase the gap between the gate voltage and the threshold voltage of the pMOS transistor 104. Also, a combination of enable transistors between both an internal and external $V_{dd}$ power supply line as well as in between an internal and external $V_{ss}$ power supply line can be thought of without departing from the scope of the invention.

FIG. 2 is described with backreference to the detailed description of FIG. 1. Corresponding reference numerals have the same meaning unless stated otherwise. In FIG. 2, a battery powered electronic device 200, e.g. a handheld computer, a laptop computer, a personal assistant, a mobile phone and so on, incorporates an integrated circuit 100 according to the present invention. Only external power supply line 130 of integrated circuit 100 is explicitly shown in FIG. 2; this is done for reasons of clarity only. External power supply line 130 is coupled by line 230 to a contact 222 of battery container 220; the connection between contact 224 of battery container 220 and power supply line 110 is not shown for reasons of clarity. In standby mode of circuit portion 102, the battery not shown in battery container 220 will have to provide hardly any power to circuit portion 102 because of the applied backbias to the gate of enable transistor 104. The circuit portion 102 will be switched to a standby mode under control of the control circuitry not shown; this control circuitry can either be partly or completely integrated in the battery powered electronic device 200 outside the integrated circuit 100, or can be integrated into integrated circuit 100. The presence of integrated circuit 100 according to the present invention drastically increases the lifetime of the battery not shown of a battery powered electronic device 200, which increases its marketability significantly, because the stand alone operation time, e.g. the time that battery powered electronic device 200 can operate without being connected to a power supply other than the battery, is an important feature for marketing such products.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An integrated circuit (100), comprising:
   an external power supply line (130);
   an internal power supply line (120);
   a circuit portion (102) coupled to the internal power supply line (120);
   an enable transistor (104) for coupling the internal power supply line (120) to the external power supply line (130); and
   control means (150, 160) coupled to a gate of the enable transistor (104) for switching the enable transistor (104) to a conductive state with a first gate voltage, and to a non-conductive state with a second gate voltage,
   characterized in that the control means (150, 160) are arranged to reduce a leakage current through the enable transistor (104) in the non-conductive state by biasing the gate with the second gate voltage, which is obtained from a back bias power supply line (140) which is separate from said external power supply line (130).

2. An integrated circuit (100) as claimed in claim 1, characterized in that the control means (150) comprise a further transistor (154) having a substrate that is conductively insulated from a bulk substrate of the integrated circuit, the substrate being coupled to a bias voltage source (170), and the further transistor (154) being responsive to a control signal for switching the enable transistor (104) to a non-conductive state.

3. An integrated circuit (100) as claimed in claim 2, characterized in that the bias voltage source (170) comprises a backbias generator being responsive to the control signal.

4. A battery-powered electronic device (200), comprising a power supply line (230) coupled to a contact (222) of a battery container (220), characterized in that the power supply line (230) is coupled to an external power supply line (130) of an integrated circuit (100) according to claim 1.

* * * * *